United States Patent
Myers et al.

(10) Patent No.: US 6,703,128 B2
(45) Date of Patent: Mar. 9, 2004

(54) THERMALLY-CAPACITIVE PHASE CHANGE ENCAPSULANT FOR ELECTRONIC DEVICES

(75) Inventors: Bruce A. Myers, Kokomo, IN (US); Arun K. Chaudhuri, Carmel, IN (US); Jeffrey H. Burns, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 70 days.

(21) Appl. No.: 10/075,981

(22) Filed: Feb. 15, 2002

(65) Prior Publication Data

US 2003/0157342 A1 Aug. 21, 2003

(51) Int. Cl.$^7$ ................................................. B32B 5/16
(52) U.S. Cl. .................... 428/403; 428/407; 524/439; 524/440; 524/588
(58) Field of Search ................... 428/402, 403, 428/407; 524/439, 440, 588

(56) References Cited

U.S. PATENT DOCUMENTS

| | | | |
|---|---|---|---|
| 5,007,478 A | 4/1991 | Sengupta | 165/10 |
| 5,224,356 A | 7/1993 | Colvin et al. | 62/259 |
| 5,366,801 A | 11/1994 | Bryant et al. | 428/283 |
| 5,499,460 A | 3/1996 | Bryant et al. | 36/43 |
| 5,709,945 A | 1/1998 | Lee et al. | 428/403 |
| 5,851,338 A | 12/1998 | Pushaw | 156/278 |
| 6,485,595 B1 * | 11/2002 | Yenni et al. | 156/221 |
| 2003/0027910 A1 * | 2/2003 | Misra et al. | 524/404 |
| 2003/0077478 A1 * | 4/2003 | Dani et al. | 428/673 |

FOREIGN PATENT DOCUMENTS

WO   wo-02083440 A2 * 10/2003

* cited by examiner

*Primary Examiner*—Robert Dawson
*Assistant Examiner*—Marc S. Zimmer
(74) *Attorney, Agent, or Firm*—Jimmy L. Funke; Stefan V. Chmielewski

(57) ABSTRACT

An encapsulation material suitable for dissipating heat generated by an electronic module, such as by directly contacting a heat-generating power device or contacting a heat sink of a heat-generating power device. The encapsulation material comprises phase change particles dispersed in a gel material. The phase change particles preferably comprise a solder alloy encapsulated by a dielectric coating so the phase change particles are electrically insulated from each other. The encapsulation material may further comprise dielectric particles dispersed in the gel material for the purpose of increasing the thermal conductivity of the encapsulation material. Alternatively or in addition, the dielectric coating on the phase change particles may comprise dielectric particles that are dispersed in a dielectric matrix, again with the preferred effect of increasing the thermal conductivity of the encapsulation material.

20 Claims, 3 Drawing Sheets

THERMALLY-CAPACITIVE PHASE CHANGE ENCAPSULANT FOR ELECTRONIC DEVICES

STATEMENT REGARDING FEDERALLY-SPONSORED RESEARCH

Not applicable.

BACKGROUND OF THE INVENTION

The present invention generally relates to methods and systems for managing/dissipating heat generated by electronic devices. More particularly, this invention relates to an encapsulation material for electronic devices, in which the encapsulation material contains a phase change material that absorbs heat generated by transient thermal events.

Heat generated by electronic devices during normal operation can cause overheating and device failure if not conducted away. While steady-state heat must be removed from the device and dissipated to the surrounding environment to prevent overheating, transient energy can be absorbed by the device and any surrounding packaging material and then dissipated to the environment more slowly. An example of a packaging material is a potting compound used to seal and protect a circuit device mounted on a circuit board within an open or closed case. Transient thermal energy can be absorbed with the use of packaging materials by two mechanisms. The first and most commonly used is the energy absorbed by the packaging material due to its inherent specific heat. The second and less commonly used mechanism is to absorb thermal energy by using the latent heat of the packaging material as the material undergoes a phase change. The most common phase change materials are of three types: solid-to-liquid, liquid-to-gas, and solid-to-solid phase change. Each of these types of phase change materials has disadvantages for electronic applications. Though solid-to-liquid phase change materials are capable of absorbing relatively large amounts of thermal energy, costly sealed containment is required to prevent loss of the material when in the liquid state. Liquid-to-gas phase change materials are capable of absorbing even greater amounts of thermal energy, but the cost of containing the gas phase is typically higher than that for solid-to-liquid materials. Alternatively, the heat dissipation system must allow for replenishing the phase change material. In contrast to the preceding materials, solid-to-solid phase change materials do not require special or complicated containment structures. However, the energy absorption of these materials is considerably less than solid-to-liquid or liquid-to-gas phase change materials. Another shortcoming is that solid-to-solid phase change materials are unable to provide an effective barrier to liquid and ionic contamination when used to encapsulate or pot electronic modules.

It can be appreciated that for a phase change material to be suitable for a wide range of applications in electronic products, the material should not only have relatively high thermal capacitance during the phase change, but should also be relatively low cost and self-containing, i.e., not require any sealing or special containment over the operating temperature range of the device being packaged. Additional desirable properties for electronic applications include a high thermal conductivity to quickly transport heat away from a heat-generating component, and the capability of customizing the temperature at which the phase change occurs. The capability to be used as a potting compound is also desirable for many applications, requiring that the phase change material have a high electrical resistance for direct contact with an electrical circuit and the ability to stop liquid and ionic intrusion. As a potting material, the material should also preferably have low ionic content for corrosion resistance, a low elastic modulus over the intended temperature range in order to minimize stress on the electrical components during thermal cycling, and good adhesion and minimal material property changes after long term exposure to the operating environment. While phase change materials exist that have several or more of these preferred characteristics, it would be desirable if a phase change material existed that exhibited each of the characteristics to the degree necessary to be useful in a wide variety of applications, and particularly as an encapsulation or potting material for an electronic module.

BRIEF SUMMARY OF THE INVENTION

The present invention provides an encapsulation material suitable for dissipating heat generated by an electronic module, such as by directly contacting a heat-generating power device or contacting a heat sink of a heat-generating power device. The encapsulation material comprises phase change particles dispersed in a polymer matrix material. The particles preferably comprise a metallic alloy encapsulated by a dielectric coating so the particles are electrically insulated from each other. The encapsulation material may further comprise dielectric particles dispersed in the polymer matrix material for the purpose of increasing the thermal conductivity of the encapsulation material. Alternatively or in addition, the dielectric coating on the particles may comprise dielectric particles that are dispersed in a dielectric matrix, again with the preferred effect of increasing the thermal conductivity of the encapsulation material.

According to the invention, the metallic alloy particles enable the encapsulation material to perform as a solid-to-liquid phase change material having characteristics highly desirable for use in electronic applications. For example, the encapsulation material is thermally conductive and has relatively high thermal capacitance during the phase change as a result of the presence of the metallic alloy particles, yet can be used in the form of a semisolid gel capable of containing the molten metallic particles so as not to require complicated sealing or containment over the operating temperature range of the particular electronic application. As a result of the polymer matrix material, the encapsulation material of this invention is electrically nonconductive and capable of stopping liquid and ionic intrusion, and therefore is suitable as a potting material. In addition, preferred polymer matrix materials have low ionic content for corrosion resistance, a low modulus to minimize thermally-induced mechanical stresses, good adhesion properties, and stable material properties even after long exposures within operating environments typically required of electronic devices.

Other objects and advantages of this invention will be better appreciated from the following detailed description.

DETAILED DESCRIPTION OF THE INVENTION

Figure 1:
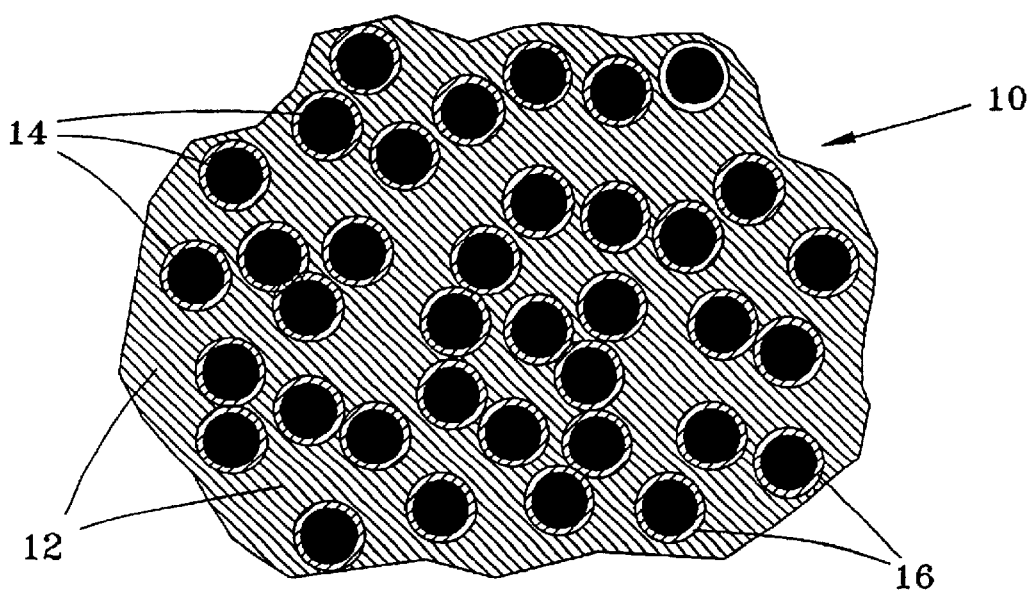
FIGS. 1, 2 and 3 represent encapsulation materials in accordance with three embodiments of the present invention.
Figure 2:
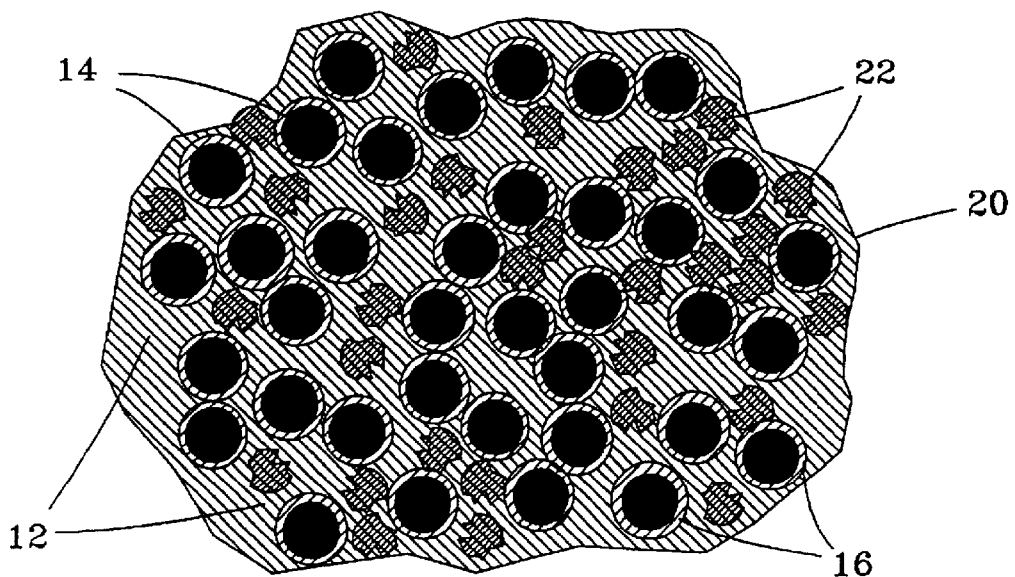
Figure 3:
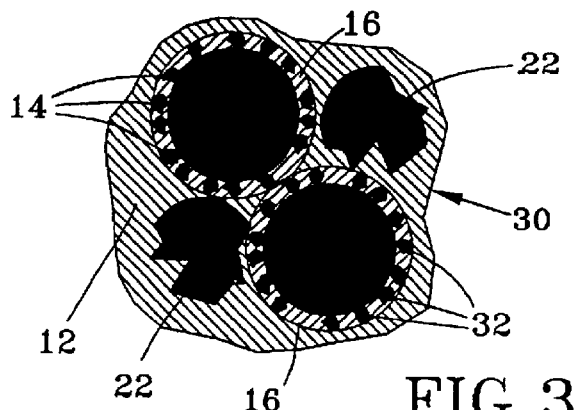
Figure 4:
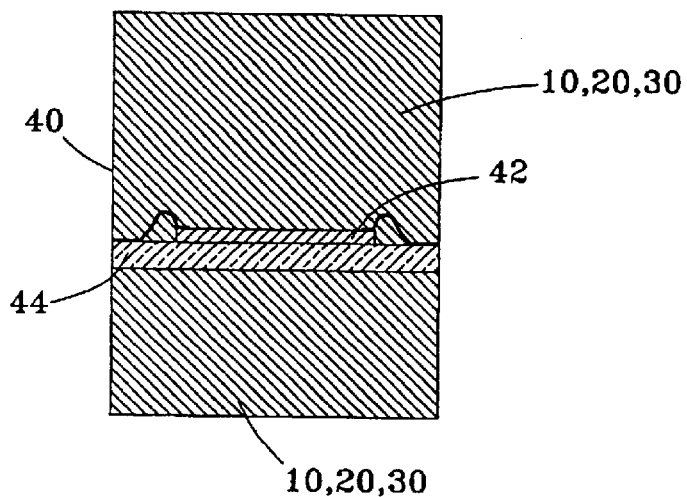
FIGS. 4 and 5 represent two applications for the encapsulation materials of this invention.

FIGS. 1 through 3 represent three encapsulation materials formulated to have properties of a phase change material in accordance with the present invention. The encapsulation material of each embodiment may also be termed a potting compound, as the material is especially formulated for use to pot a heat-generating power device on a circuit board or an entire electronic module, as shown in FIG. 4. In each embodiment, metallic alloy particles are employed to enable the encapsulation material to perform as a solid-to-liquid phase change material having characteristics highly desired for use in electronic applications.

With reference to FIG. 1, the encapsulation material 10 is represented as comprising a matrix material 12 in which coated metal alloy particles 14 are dispersed to provide the phase change thermal properties desired for the material 10. Desirable properties for the encapsulation material 10 include those that facilitate handling, such as a suitable viscosity for dispensing the material 10, and those that promote the integrity of the final encapsulated module or package, such as adequate strength and dielectric properties and a low elastic modulus. Preferred materials for the matrix material 12 include silicone gels as a result of such materials having advantageous properties for potting applications, including their ability for self-containment (as a result of being a gel), the ability to stop liquid and ionic intrusion, high electrical resistance, low ionic content for corrosion resistance, low modulus, good adhesion and minimal material property changes after long exposures to high temperatures. A particularly suitable silicone gel is available from Dow Corning under the name TOUGH GEL-4207®, which is generally a mixture of dimethyl siloxane, dimethyl siloxane-dimethyl vinyl terminated, dimethyl siloxane-hydrogen terminated, trimethylate silica, and dimethyl solxane. Tough Gel is particularly suitable as having a viscosity (about 4.5 poise at 25° C.) before curing that allows the encapsulation material 10 to be initially applied as a viscous liquid, then cures to a soft gel solid having such desirable mechanical properties as a glass transition temperature below −40° C., a volume coefficient of thermal expansion (CTE) of about $8.2 \times 10^{-4}$ ppm/° C. (25 to 100° C.), a tensile strength of about 45 psi (about $3.1 \times 10^5$ Pa), a hardness of about 66 Shore A, elastic elongation of about 265%, and a modulus of elasticity of about 0.75 psi (about 0.05 bar), and desirable electrical properties such as a dielectric constant of about 2.78 at 100 Hz and a dielectric strength of about 385 volts/mil. However, it is foreseeable that other gel-like materials could be used as the matrix material 12 for this invention.

The composition of the particles 14 must provide certain desired properties of the encapsulation material 10, particularly the high thermal capacitance desired during phase change (solid to liquid) to maximize absorption of transient thermal events, a high thermal conductivity to quickly transport heat away from a heat-generating component, and the capability of customizing the temperature at which the phase change occurs to accommodate a wide variety of applications. Solder alloys are ideally suited to meet these requirements because, as metals, they inherently are highly thermally conductive and have a very high thermal capacitance per unit volume. In addition, solder alloys can be readily formulated to provide a range of melt (phase change) temperatures. While thermal conditions will vary depending on the particular application, solder alloys with a melting temperature (MP) or a solidus and/or liquidus temperature within a range of about 85° C. to about 200° C. should be appropriate for transient thermal events of many power-generating electronic devices. For this reason, suitable solder alloys for use with this invention include those composed of indium, tin, bismuth, lead, zinc, cadmium, copper, silver and/or gold, as well as any other metal or nonmetal that can be alloyed in a solder/metal. Preferred solder alloys are 52In/48Sn (MP=117° C.), 75In/25Sn (MP=120° C.), 46.1Bi/34.2Sn/19.3Pb (MP=123° C.), 55.5Bi/45.5Pb (MP=124° C.), 56Bi/40Sn/4Zn (MP=130° C.), 58Bi/42Sn (MP=140° C.), 60Bi/40Cd (MP=140° C.), In (MP=157° C.), 70Sn/18Pb/12In (MP=162.2° C.), and 63Sn/37Pb (MP=183° C.). A suitable size for the solder particles 14 is less than 0.5 cm, with a preferred range being about 4.5 to about 10 micrometers. The preferred size range is intended to ensure that the particles 14 will at least partially melt during a transient thermal event.

Since metal alloys are electrically conductive, the particles 14 are provided with a dielectric coating 16 to ensure that the encapsulation material 10 is not electrically conductive. A preferred material for the coating 16 is a polymer, such as an amorphous polyetherimide thermoplastic resin commercially available from General Electric under the name ULTEM®, polypropylene oxide (PPO), an acrylate commercially available from DuPont under the name ELVACITE®, and other high electrical resistivity materials that can withstand the expansion of a solder particle 14 when it melts. The coating 16 is preferably applied to the solid solder particles 14 prior to mixing the particles 14 into the matrix material 12, which ensures that the solder particles 14 will be completely encapsulated within the coating 16 so as not to provide an electrical conduction path through the encapsulation material 10. For this purpose, the coating 16 is preferably applied in a range of about 0.5 to 6% by weight of a particle 14 to yield a suitable coating thickness, with a preferred range being less than 1 weight percent to maximize the thermal conductivity of the coated particle 14.

The coated particles 14 described above are combined with the matrix material 12 to form a viscous liquid that can be cured by heat, UV exposure and/or another suitable method to yield the encapsulation material 10 having the form of a soft gel solid. Suitable mixtures contain about 50 to about 80 weight percent coated particles 14 (i.e., the particles 14 and coating 16 combined), with the balance being the matrix material 12. A preferred encapsulation material 10 using the TOUGH GEL silicone matrix material 12 contains about 60 to about 70 weight percent coated particles 14, with the balance the matrix material 12.

FIG. 2 represents an encapsulation material 20 intended for more demanding applications that require faster transfer of transient heat energy from an electrical component. The encapsulation material 20 can comprise the same matrix material 12, solder alloy particles 14 and coating 16 as that described for FIG. 1, with the addition of particles 22 of a thermally-conductive but preferably dielectric material. Suitable materials for the dielectric particles 22 are those that are more thermally conductive than the matrix material 12, and therefore serve as a filler that raises the coefficient of heat transfer of the encapsulation material 20. Certain ceramic materials are particularly suitable for this purpose, with preferred materials being alumina ($Al_2O_3$), boron nitride (BN), aluminum nitride (AlN), silicon carbide (SiC) and silicon nitride ($Si_3N_4$), though it is foreseeable that other non-electrically conductive materials with thermal conductivities of higher than that of the matrix material 12 could be used. A suitable size for the dielectric particles 22 is about 0.5 to about 200 micrometers, with a preferred range being about 0.45 to 10 micrometers for the purpose of achieving a suitable viscosity for the uncured encapsulation material 20 and a suitable thermal conductivity for the cured encapsulation material 20. Coated solder alloy particles 14 and dielectric particles 22 can be combined with the matrix material 12 at levels of about 30 to about 70 weight percent coated particles 14 (particles 14 and coating 16 combined) and about 0.5 to about 10 weight percent dielectric particles 22, with the balance being the matrix material 12. Preferred ranges for the encapsulation material 20 are about 40 to about 60 weight percent coated particles 14 (particles 14 and coating 16 combined), about 0.5 to about 2 weight percent dielectric particles 22, and about 38 to about 59.5 weight percent matrix material 12.

As shown in FIG. 3, thermal transfer through an encapsulation material 30 of this invention can be further improved with the addition of smaller thermally-conductive but preferably dielectric particles 32 to the coating 16 surrounding the solder alloy particles 14. These particles 32 are preferably added to the material for the coating 16 prior to the particles 14 being coated. The same materials discussed above for the particles 22 can be used for the particles 32. The particles 32 are preferably sized to be adhered to the solder particles 14 with the coating 16. For this reason, a suitable size range for the particles 32 is about 1 to about 40 micrometers, with a preferred size being about 2 to about 20 micrometers, which is roughly the thickness of the coating 16. The dielectric particles 32 can be used in amounts of about 50 to about 90 weight percent of the coating 16. Dielectric particles 22 and solder alloy particles 14 encapsulated with the coating 16 containing the dielectric particles 32 can be combined with the matrix material 12 at levels of about 50 to about 80 weight percent coated particles 14 (particles 14 and coating 16 combined), about 0.5 to about 10 weight percent dielectric particles 22, and about 0.5 to about 6.0 weight percent dielectric particles 32, with the balance being the matrix material 12. If the dielectric particles 22 are omitted, the solder alloy particles 14 encapsulated with the coating 16 containing the dielectric particles 32 can be combined with the matrix material 12 at levels of about 50 to about 80 weight percent coated particles 14 (particles 14 and coating 16 combined) and about 0.5 to about 6.0 weight percent dielectric particles 32, with the balance matrix material 12. Preferred ranges for the encapsulation material 30 are about 1.0 to about 5.0 weight percent dielectric particles 22, about 60 to about 70 weight percent coated particles 14 (i.e., particles 14, coating 16 and dielectric particles 32 combined), and about 25 to about 39 weight percent matrix material 12.

Figure 5:
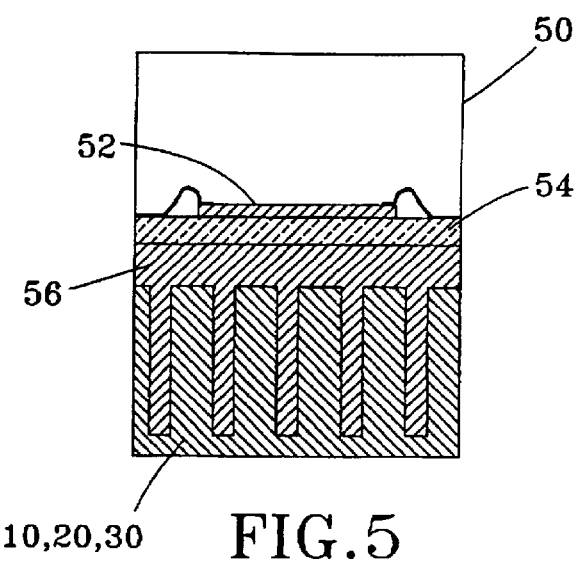

With each of the above embodiments, the encapsulation material 10, 20 and 30 is preferably applied in a liquid form and then subsequently cured by heat, UV exposure and/or other methods known in the industry. The cured encapsulation materials 10, 20 and 30 have the consistency of a soft gel solid, which enables their use as potting compounds. FIGS. 4 and 5 represent two applications for the encapsulation materials 10, 20 and 30 of this invention. In FIG. 4, the encapsulation material 10, 20 or 30 is represented as being used to pot an electronic module 40 that comprises an electronic power device 42 mounted to a circuit board 44. The encapsulation material 10, 20 or 30 is in direct contact with the power device 42 as well as the backside of the circuit board 44, as would be the case when the encapsulation material 10, 20 or 30 is used as a potting compound to seal the device 42 and circuit board 44 within an open or closed case (not shown), thereby protecting the device 42 from a hostile operating environment. In FIG. 5, the encapsulation material 10, 20 or 30 is used as a filler in contact with a heat sink 56 of an electronic module 50 comprising an electronic power device 52 on a circuit board 54. Although the filled encapsulation materials 20 and 30 are much more thermally conductive than the unfilled encapsulation material 10, under most conditions the heat sink 56 will be a better conductor of thermal energy. Still, with the embodiment of FIG. 5 the encapsulation material 10, 20 or 30 allows for faster energy transfer from the power device 52 into a large volume of phase change material, increasing the amount of thermal energy that can be quickly absorbed after being conducted from the power device 52 through the heat sink 56.

As examples of the present invention, encapsulation materials were formulated to contain solder (phase change) particles of 63Sn/37Pb individually encapsulated by a dielectric coating that contained boron nitride particles commercially available under the name Polar Therm Powder PT-180 from Advanced Ceramics Corporation. The solder particles had an average particles size of less than 45 micrometers (−325 mesh+500 mesh), while the boron nitride particles had a particle size range of about 5 to 15 micrometers and a surface area of about 15 to 21 $m^2/g$. In a first example of the invention, the solder particles were granulated with about 1.5 weight percent ULTEM in a fluid bed to form a dielectric coating, and then further coated with about 0.5 weight percent of the boron nitride particles and about 0.5 weight percent PPO. In a second example of the invention, the same materials were used but the solder particles combined with about 1.5 weight percent ULTEM, about 1 weight percent of the boron nitride particles and about 1 weight percent PPO.

Figure 6:
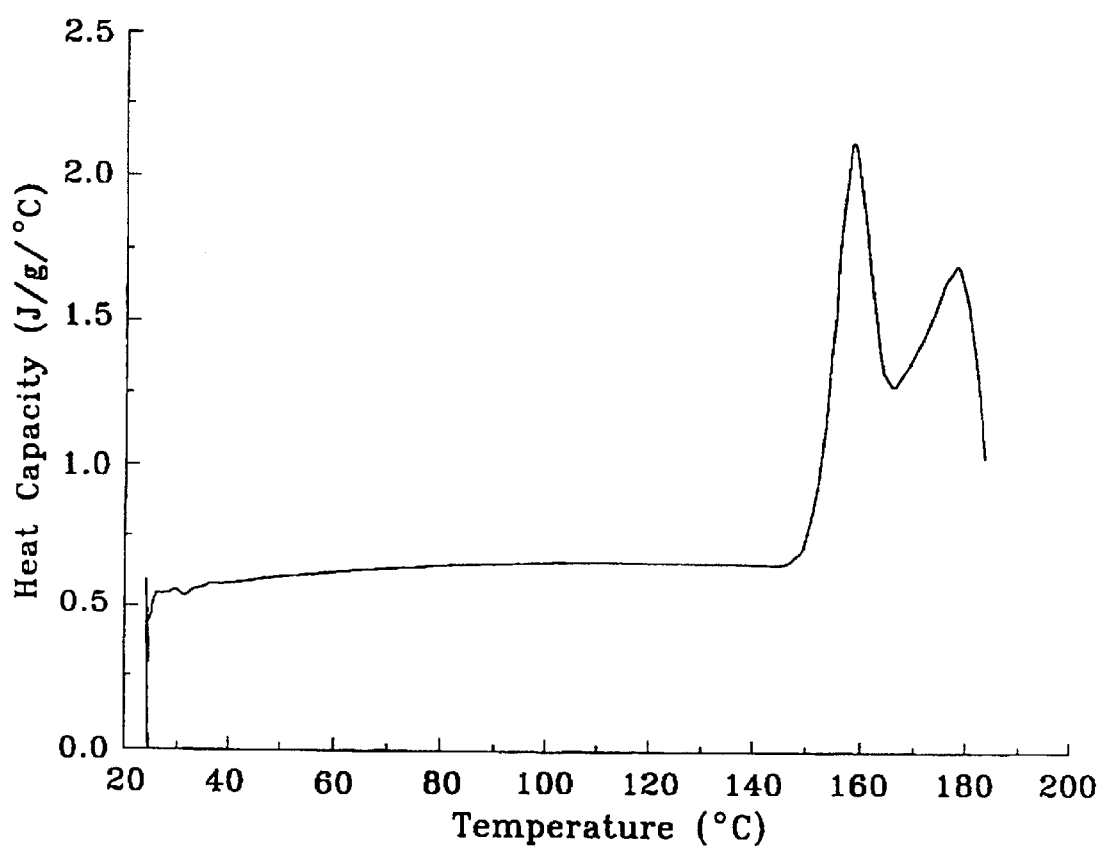
FIG. 6 is a data plot evidencing a sharp increase in thermal capacitance occurring over a limited temperature range for an encapsulation material formulated in accordance with this invention.

Samples of each type of coated particle were then admixed with TOUGH GEL silicone at a level of about 50 weight percent coated particles. The resulting viscous liquids were cured at a temperature of about 85° C. for about 20 minutes to form encapsulation materials characterized as a soft gel solid. The encapsulation materials were then analyzed by heating from about 30 to about 200° C. at a rate of about 5° C. per minute. The materials exhibited a sharp increase in heat absorption over a temperature range of about 154° C. to about 183° C., with a maximum peak at about 161° C. The observed increase in heat absorption corresponds to a relatively high thermal capacitance as a result of the phase change of the solder alloy particles. FIG. 6 is an illustrative data plot of heat capacity versus temperature for one of the encapsulation materials.

While the invention has been described in terms of a preferred embodiment, it is apparent that other forms could be adopted by one skilled in the art. Accordingly, the scope of the invention is to be limited only by the following claims.

What is claimed is:

1. An encapsulation material for an electronic module, the encapsulation material comprising:
   a polymer matrix material; and
   electrically-conductive phase change particles dispersed in the matrix material, the phase change particles being encapsulated by a dielectric coating so as to be electrically insulated from each other;
   wherein the dielectric coating is a polymer capable of containing the phase change particles when molten.

2. An encapsulation material for an electronic module, the encapsulation material comprising:
   a polymer matrix material; and
   electrically-conductive phase change particles dispersed in the matrix material, the phase change particles being encapsulated by a dielectric coating so as to be electrically insulated from each other;

wherein the matrix material is formed of a silicone gel and the phase change particles are formed of a solder alloy.

3. The encapsulation material according to claim 2, wherein the solder alloy comprises indium, tin, bismuth, lead, zinc, cadmium, copper, silver and/or gold.

4. The encapsulation material according to claim 1, further comprising dielectric particles dispersed in the matrix material, the dielectric particles having a higher coefficient of thermal conductivity than the matrix material.

5. The encapsulation material according to claim 4, wherein the dielectric particles are formed of a ceramic material.

6. The encapsulation material according to claim 4, wherein the dielectric coating comprises second dielectric particles dispersed in a dielectric matrix, the second dielectric particles being smaller than the dielectric particles dispersed in the matrix material.

7. The encapsulation material according to claim 6, wherein the second dielectric particles are formed of a ceramic material having a higher coefficient of thermal conductivity than the matrix material.

8. The encapsulation material according to claim 2, wherein the dielectric coating is a polymer capable of containing the phase change particles when molten.

9. An encapsulation material for an electronic module, the encapsulation material comprising:

a polymer matrix material; and electrically-conductive phase change particles dispersed in the matrix material, the phase change particles being encapsulated by a dielectric coating so as to be electrically insulated from each other;

wherein the dielectric coating comprises dielectric particles dispersed in a dielectric matrix.

10. The encapsulation material according to claim 9, wherein the dielectric particles are formed of a ceramic material having a higher coefficient of thermal conductivity than the matrix material.

11. The encapsulation material according to claim 1, wherein the encapsulation material contacts a heat-generating power device.

12. The encapsulation material according to claim 1, wherein the encapsulation material contacts a heat sink of a heat-generating power device.

13. An encapsulation material contacting an electronic assembly, the encapsulation material comprising:

about 50 to about 80 weight percent of electrically-conductive phase change particles comprising a solder alloy encapsulated by a dielectric polymer coating so as to be electrically insulated from each other, the dielectric polymer coating being capable of containing the phase change particles when molten;

about 0.5 to about 10 weight percent of dielectric particles; and the balance essentially a silicone gel in which the electrically-conductive phase change particles and the dielectric particles are dispersed, the dielectric particles having a higher coefficient of thermal conductivity than the silicone gel.

14. The encapsulation material according to claim 13, wherein the dielectric particles are formed of alumina, boron nitride, aluminum nitride, silicon carbide and/or silicon nitride.

15. The encapsulation material (30) according to claim 13, wherein the dielectric polymer coating contains about 50 to about 90 weight percent of second dielectric particles dispersed in a polymer matrix, the second dielectric particles having a higher coefficient of thermal conductivity than the silicone gel.

16. The encapsulation material according to claim 15, wherein the second dielectric particles are formed of alumina, boron nitride, aluminum nitride, silicon carbide and/or silicon nitride.

17. The encapsulation material according to claim 15, wherein the second dielectric particles are smaller than the dielectric particles dispersed in the silicone gel.

18. The encapsulation material according to claim 13, wherein the encapsulation material surrounds and contacts a heat-generating electronic device.

19. The encapsulation material according to claim 13, wherein the encapsulation material contacts a heat sink of a heat-generating electronic device.

20. The encapsulation material according to claim 13, wherein the solder alloy is at least one alloy selected from the group consisting of 52In/48Sn, 75In/25Sn, 46.1Bi/34.2Sn/19.3Pb, 55.5Bi/45.5Pb, 56Bi/40Sn/4Zn, 58Bi/42Sn, 60Bi/40Cd, In, 70Sn/18Pb/12In and 63Sn/37Pb.

* * * * *